(12) United States Patent
Chou et al.

(10) Patent No.: US 8,951,848 B2
(45) Date of Patent: Feb. 10, 2015

(54) CIRCUIT SUBSTRATE FOR MOUNTING CHIP, METHOD FOR MANUFACTURING SAME AND CHIP PACKAGE HAVING SAME

(71) Applicant: Zhen Ding Technology Co., Ltd., Tayuan, Taoyuan (TW)

(72) Inventors: E-Tung Chou, Tayuan (TW); Chih-Jen Hsiao, Tayuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 82 days.

(21) Appl. No.: 13/771,320

(22) Filed: Feb. 20, 2013

(65) Prior Publication Data
US 2014/0027893 A1  Jan. 30, 2014

(30) Foreign Application Priority Data
Jul. 26, 2012  (CN) .................. 2012 1 02611621

(51) Int. Cl.
| | |
|---|---|
| *H01L 21/00* | (2006.01) |
| *H05K 1/11* | (2006.01) |
| *H01L 23/00* | (2006.01) |
| *H01L 23/495* | (2006.01) |
| *H05K 1/09* | (2006.01) |
| *H01L 21/48* | (2006.01) |
| *H01L 23/498* | (2006.01) |
| *H01L 23/31* | (2006.01) |

(52) U.S. Cl.
CPC ............... *H05K 1/112* (2013.01); *H01L 24/81* (2013.01); *H01L 23/4952* (2013.01); *H05K 1/09* (2013.01); *H01L 21/48* (2013.01); *H01L 23/49816* (2013.01); *H01L 23/3128* (2013.01); *H01L 23/49827* (2013.01); *H01L 21/486* (2013.01); *H01L 2224/16225* (2013.01); *H01L 2224/32225* (2013.01); *H01L 2224/48091* (2013.01); *H01L 2224/48227* (2013.01); *H01L 2224/48228* (2013.01); *H01L 2224/73204* (2013.01); *H01L 2224/73265* (2013.01); *H01L 2924/15311* (2013.01); *H01L 2924/15174* (2013.01); *H01L 2924/15184* (2013.01)
USPC .......................................................... 438/126

(58) Field of Classification Search
USPC .......................................................... 438/126
See application file for complete search history.

(56) References Cited

U.S. PATENT DOCUMENTS

| | | | | |
|---|---|---|---|---|
| 6,617,680 | B2* | 9/2003 | Chien-Chih et al. | .......... 257/698 |
| 8,039,949 | B2* | 10/2011 | Zhao et al. | .................... 257/701 |
| 8,263,439 | B2* | 9/2012 | Marimuthu et al. | .......... 438/126 |
| 8,590,145 | B2* | 11/2013 | Eichelberger et al. | .......... 29/832 |

(Continued)

*Primary Examiner* — Yu-Hsi D Sun
*Assistant Examiner* — Grant Withers
(74) *Attorney, Agent, or Firm* — Novak Druce Connolly Bove + Quigg LLP

(57) ABSTRACT

A circuit board includes an insulation layer, an electrically conductive layer, and a solder mask layer. The insulation layer has a plurality of through holes passing through. The electrically conductive layer is formed on a surface of the insulation layer and covers the through holes. The electrically conductive layer has a plurality of portions exposed in the through holes to serve as a plurality of first conductive pads. The solder mask layer covers the electrically conductive layer and defines a plurality of openings to expose parts of the electrically conductive layer. Parts of the electrically conductive layer are exposed to the solder mask layer to serve as a plurality of second conductive pads. The second conductive pads are electrically connected to the first conductive pads respectively. This disclosure further relates to a chip package and a method of manufacturing the same.

6 Claims, 14 Drawing Sheets

(56) References Cited

U.S. PATENT DOCUMENTS

| | | | |
|---|---|---|---|
| 2006/0237389 A1* | 10/2006 | Chou et al. | 216/13 |
| 2006/0243482 A1* | 11/2006 | Chou et al. | 174/262 |
| 2008/0089048 A1* | 4/2008 | Yamano et al. | 361/812 |
| 2008/0206926 A1* | 8/2008 | Sakamoto et al. | 438/110 |
| 2010/0052151 A1* | 3/2010 | Zhao et al. | 257/692 |
| 2010/0267208 A1* | 10/2010 | Oi et al. | 438/126 |
| 2011/0180926 A1* | 7/2011 | Shah et al. | 257/723 |
| 2011/0193203 A1* | 8/2011 | Goto et al. | 257/659 |
| 2011/0207266 A1* | 8/2011 | Lee et al. | 438/126 |
| 2013/0075926 A1* | 3/2013 | Bae et al. | 257/774 |
| 2013/0230947 A1* | 9/2013 | Hsu et al. | 438/126 |
| 2013/0277832 A1* | 10/2013 | Lin et al. | 257/737 |
| 2014/0085833 A1* | 3/2014 | Hsu et al. | 361/728 |
| 2014/0117553 A1* | 5/2014 | Ha Woo et al. | 257/762 |
| 2014/0117555 A1* | 5/2014 | Liang et al. | 257/773 |
| 2014/0167234 A1* | 6/2014 | Hurwitz et al. | 257/668 |
| 2014/0185259 A1* | 7/2014 | Ha Woo et al. | 361/777 |
| 2014/0231989 A1* | 8/2014 | Pagaila et al. | 257/737 |
| 2014/0239510 A1* | 8/2014 | Malatkar | 257/774 |
| 2014/0252609 A1* | 9/2014 | Lee et al. | 257/738 |

* cited by examiner

CIRCUIT SUBSTRATE FOR MOUNTING CHIP, METHOD FOR MANUFACTURING SAME AND CHIP PACKAGE HAVING SAME

BACKGROUND

1. Technical Field

The present disclosure relates to a circuit substrate for mounting a microchip, a method for manufacturing the circuit substrate, and a chip package structure having the circuit substrate.

2. Description of Related Art chip packages may include a circuit substrate and a chip. The PCB is configured to form a connecting pad. Most of the circuit substrates include a plurality of patterned electrically conductive layers, which make the circuit substrate thick.

What is needed therefore is a circuit substrate, a method for manufacturing the same and a chip package having the circuit substrate to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
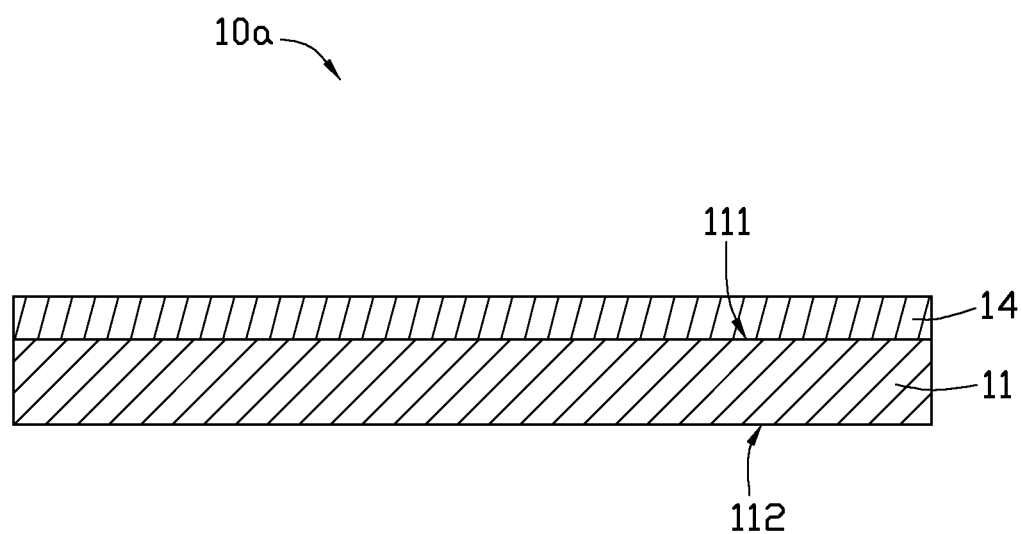
FIG. 1 is a cross-sectional view of a flexible single-sided copper clad laminate in accordance with a first exemplary embodiment, comprising an insulation layer and a copper foil formed on the insulation layer.

Various embodiments will now be described in detail below with reference to the drawings.

FIGS. 1-13 show a method for manufacturing a chip package in accordance with a first exemplary embodiment. The method includes the following steps.

Step (1): FIGS. 1-4 show a flexible single-sided circuit board 10. The flexible single-sided circuit board 10 includes an insulation layer 11 and an patterned electrically conductive layer 12 formed on the insulation layer 11. The insulation layer 11 has a first surface 111, an opposite second surface 112, and a plurality of through holes 13 passing through the first surface 111 and the second surface 112. The patterned electrically conductive layer 12 is formed on the first surface 111 of the insulation layer 11, and covers the through holes 13.

The flexible single-sided circuit board 10 can be formed by the following process:

First, referring to FIG. 1, a flexible single-sided copper clad laminate (CCL) 10a is provided. The flexible single-sided CCL 10a includes the insulation layer 11 and a copper foil 14. The copper foil 14 is formed on the first surface 111 of the insulation layer 11. A material of the insulation layer 11 can be selected from the group consisting of Polyimide (PI), Polyethylene Terephthalate (PET) and Polyethylene Naphthalate (PEN). A thickness of the insulation layer 11 can be in the range from 15 µm to 250 µm, and preferably from 25 µm to 50 µm. A thickness of the copper foil 14 can be in the range from 12 µm to 35 µm.

Figure 2:
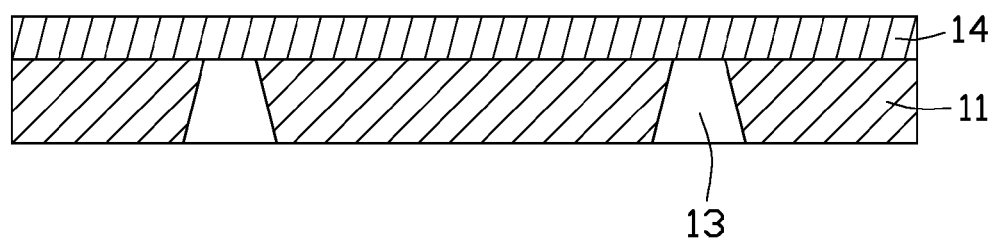
FIG. 2 shows through holes defined in the insulation layer of the flexible single-sided copper clad laminate of FIG. 1.

Second, FIG. 2 shows that the through holes 13 are formed using a laser bombarding method or a drilling method. The through holes 13 pass through the first surface 111 and the second surface 112, and terminate at the copper foil 14, thus the copper foil 14 is exposed to the through holes 13. In this embodiment, each through hole 13 has a round cross section.

Figure 3:
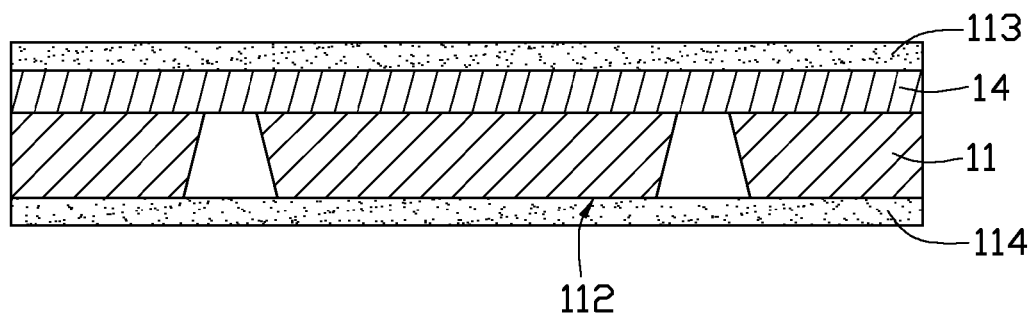
FIG. 3 shows two etch-resistant coatings formed on opposite sides of the flexible single-sided copper clad laminate of FIG. 2.
Figure 4:
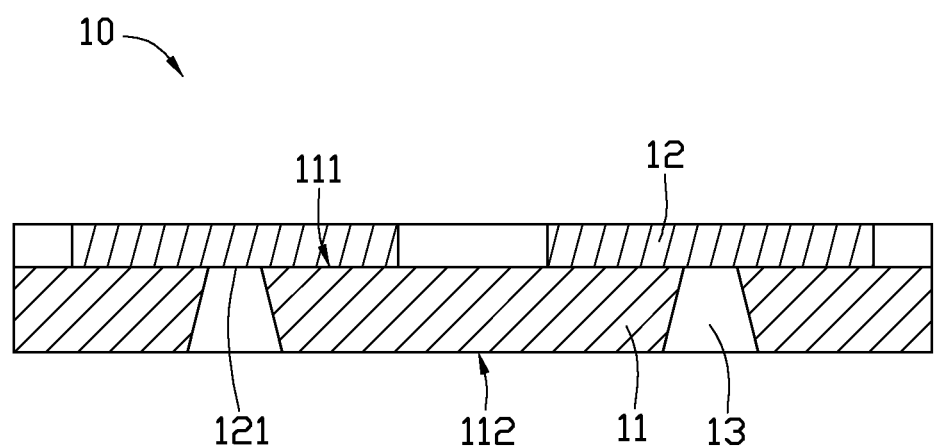
FIG. 4 shows the copper foil of FIG. 3 converted into a patterned electrically conductive layer and the two etch-resistant coatings removed.

Finally, FIGS. 3-4 show that the copper foil 14 is partly removed. The removing of the copper foil 14 forms the patterned electrically conductive layer 12. The patterned electrically conductive layer 12 covers the through holes 13. The patterned electrically conductive layer 12 has a plurality of portions exposed in the through holes 13 to sever as a plurality of first conductive pads 121. The patterned electrically conductive layer 12 can be formed by using exposure, developing, and etching methods. An example of a method for forming the patterned electrically conductive layer 12 is described in detail as follows:

First, referring to FIG. 3, a first etch-resistant coating 113 is formed on the copper foil 14, and a second etch-resistant coating 114 is formed on the second surface 112 of the insulation layer 11. The first etch-resistant coating 113 covers the entire surface of the copper foil 14, and the second etch-resistant coating 114 covers the entire second surface 112 and openings of the through holes 13. In this embodiment, the first and second etch-resistant coatings 113 and 114 are a dry-film type. The second etch-resistant coating 114 prevents the copper foil 14 in the through holes 13 from being etched by etchant applied in a following step. In an alternative embodiment, the second etch-resistant coating 114 covers the openings of all through holes 13 and part of the second surface 112. The first and second etch-resistant coatings 113 and 114 can also be a wet-film type.

Then, the first etch-resistant coating 113 is patterned by being partly exposed to a UV light and then being developed, thus part of the copper foil 14 is exposed. Furthermore, the exposed copper foil 14 is removed by an etching method. Finally, the remaining first etch-resistant coating 113 and the second etch-resistant coating 114 are removed by a stripping process, thereby obtaining the flexible single-sided circuit board 10.

Figure 5:
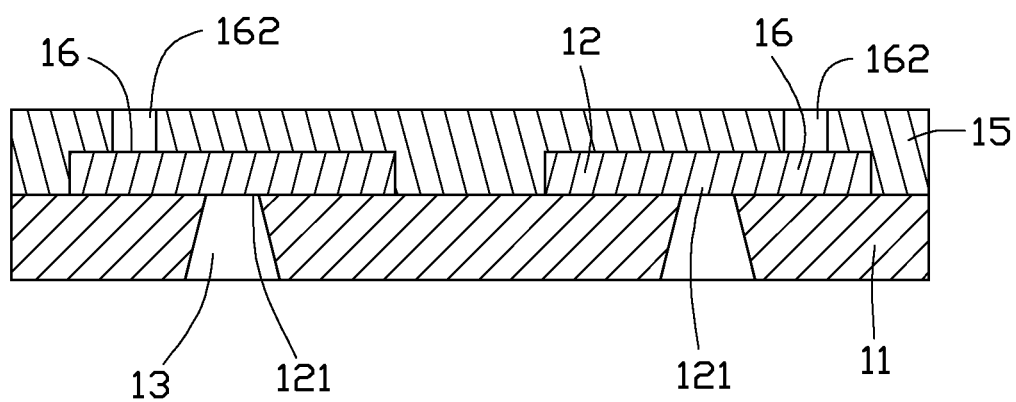
FIG. 5 shows a solder mask layer formed on the patterned electrically conductive layer of FIG. 4, and a plurality of openings defined in the solder mask layer for exposing part of the patterned electrically conductive layer, thereby forming a plurality of conductive pads.

Step (2): FIG. 5 shows that a solder mask layer 15 is formed on the patterned electrically conductive layer 12 and the first surface 111 not covered by the patterned electrically conductive layer 12. The solder mask layer 15 defines a plurality of openings 162 for exposing part of the patterned electrically conductive layer 12. The patterned electrically conductive layer 12 exposed to the openings 162 serves as a plurality of second conductive pads 16. The second conductive pads 16 are respectively electrically connected to the first conductive pads 121. In this embodiment, a material of the solder mask layer 15 can be liquid photoimageable solder resist ink or thermosetting solder resist ink.

It is to be understood that the method of steps (1)-(2) can be a roll-to-roll process.

Figure 6:
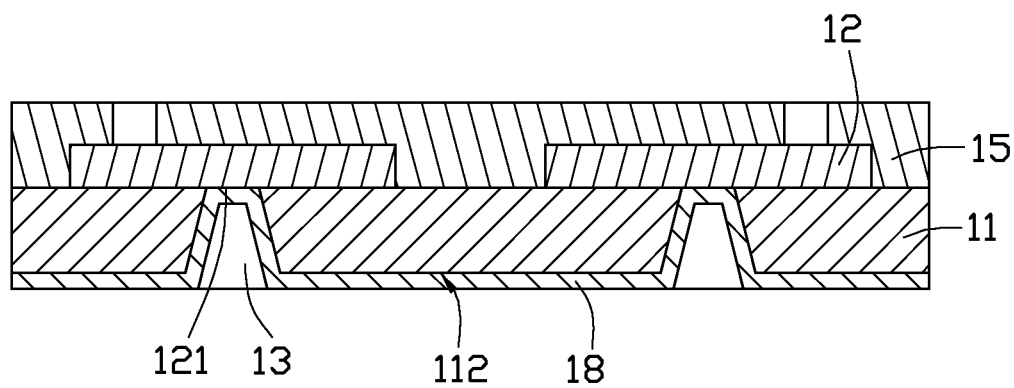
FIG. 6 shows a seed layer formed on a surface of the insulation layer of FIG. 5 facing away from the patterned electrically conductive layer, an inner surface of the through hole and a surface of the patterned electrically conductive layer in the through hole using a sputtering process.
Figure 7:
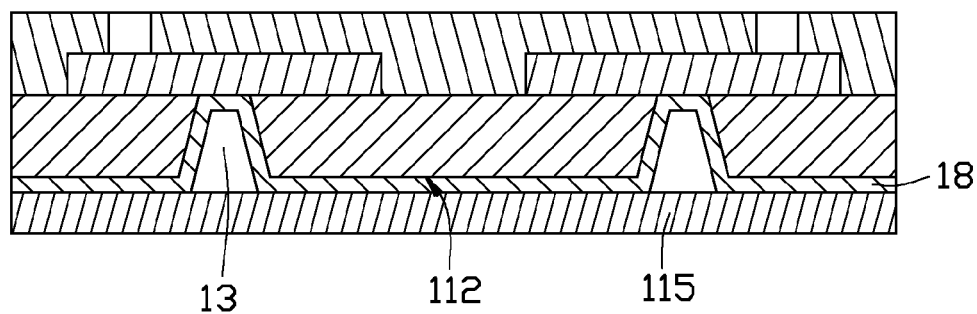
FIG. 7 shows a stiffener stacked on the seed layer of FIG. 6.
Figure 8:
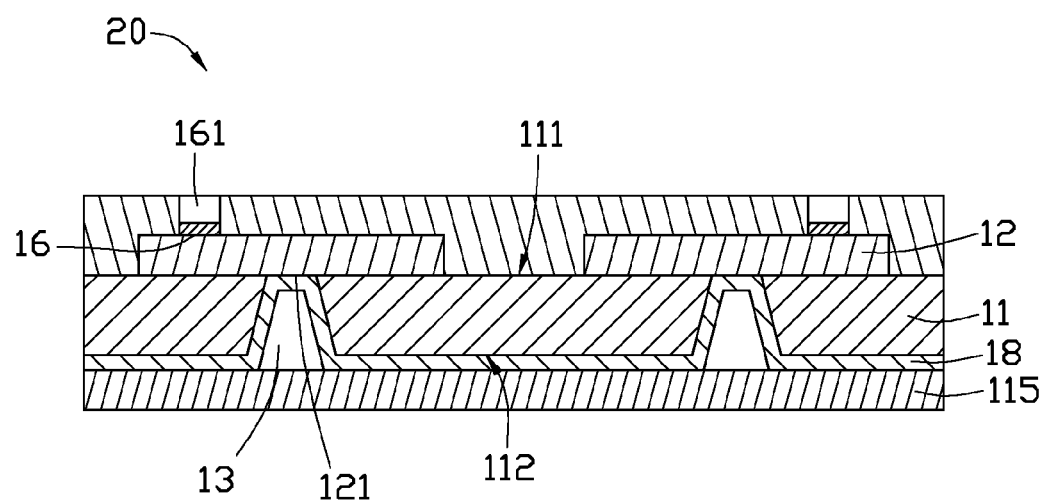
FIG. 8 shows a surface plating layer formed on each of the conductive pads of FIG. 7, thereby obtaining a circuit substrate.

Step (3): FIGS. 6-8 shows that a seed layer 18 is formed on the second surface 112, the inner surface of the through hole 13 and surfaces of the first conductive pads 121 in the through hole 13. In addition, a stiffener 115 is arranged on the seed layer 18 formed on the second surface 112. The stiffener 115 covers the second surface 112 and openings of the through holes 13 at the second surface 112. A surface plating layer 161 is formed on each of the second conductive pads 16, thereby obtaining a circuit substrate 20.

The formation of the seed layer 18, the stiffener 115 and the surface plating layer 161 is described in detail as follows:

FIG. 6 shows that the seed layer 18 is formed on the second surface 112, the inner surface of the through hole 13 and surfaces of the first conductive pads 121 in the through hole 13 using a sputtering process. Thus, the seed layer 18 is electrically connected to the patterned electrically conductive layer 12. Alternatively, an electroless copper plating method can also form the seed layer 18. A thickness of the seed layer 18 can be in the range from 5 μm to 15 μm.

FIG. 7 shows that the stiffener 115 is attached to the second surface 112. The stiffener 115 can be attached to the second surface 112 by an adhesive sheet. The stiffener 115 reinforces the rigidity of flexible single-sided circuit board 10 in the sequent process. The stiffener 115 also prevents the seed layer 18 from being plated gold in a following plating step. The stiffener 18 can be a stiffening board comprising a material selected from the group consisting of epoxy resin, phenolic resin, metal and any combination thereof.

Furthermore, FIG. 8 shows that the surface plating layer 161 is formed by gold plating, thereby protecting the second conductive pads 16 from oxidation and is beneficial for linking golden wires when mounting a chip using a wire-bonding method.

The surface plating layer 161 can also be formed by nickel gold plating, nickel palladium gold plating, or tin plating. Certainly, the surface plating layer 161 can also be omitted.

In this embodiment, the circuit board 20 includes an insulation layer 11, an patterned electrically conductive layer 12 formed the first surface 111 of the insulation layer 11, and a solder mask layer 15. The insulation layer 11 defines a plurality of through holes 13 passing through the second surface 112 and the first surface 111 of the insulation layer 11. The patterned electrically conductive layer 12 covers the through holes 13 at the first surface 111. The patterned electrically conductive layer 12 in the through hole forms a plurality of first conductive pads 121. A seed layer 18 is formed over the second surface 112, inner surfaces of the through holes 13 and the first conductive pads 121 exposed in the through holes 13. A stiffener 115 is attached to on the seed layer 18 on the second surface 112, and covers the through holes 13 at the second surface 112. The solder mask layer 15 is formed on the patterned electrically conductive layer 12 and the first surface 111 not covered by the patterned electrically conductive layer 12. The solder mask layer 15 defines a plurality of openings 162 for exposing part of the patterned electrically conductive layer 12. The patterned electrically conductive layer 12 is exposed to the openings 162 forming a plurality of second conductive pads 16. The second conductive pads 16 are respectively electrically connected to the first conductive pads 121. A surface plating layer 161 is formed on each of the second conductive pads 16.

Figure 9:
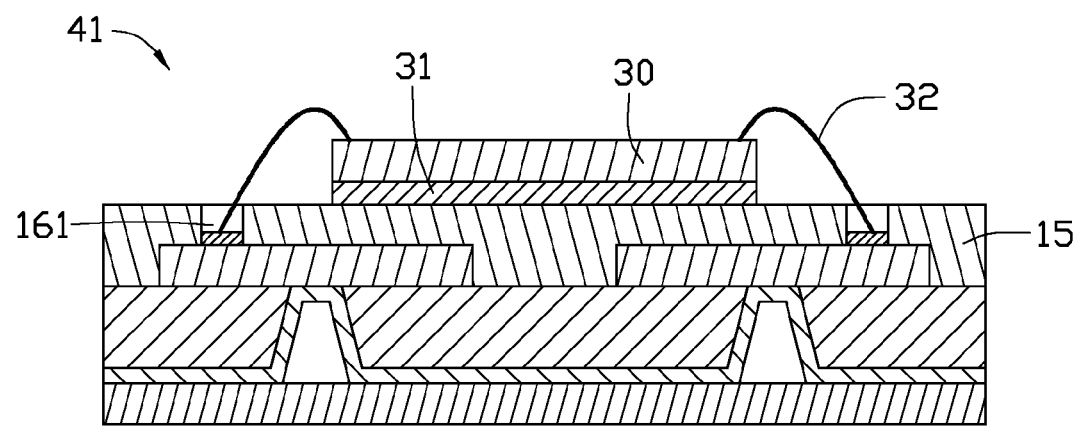
FIG. 9 shows a chip mounted on the circuit substrate of FIG. 8 through a wire-bonding method.

Step (4): referring to FIG. 9, a chip 30 is electrically connected to the surface plating layers 161 on the second conductive pads 16 through a plurality of golden wires 32. The golden wires 32 are electrically connected with the chip 30, and correspond to the second conductive pads 16. In this embodiment, the chip 30 is fixed to a surface of the solder mask layer 15 through an adhesive layer 31, and the golden wires 32 are welded to the surface plating layer 161.

Figure 10:
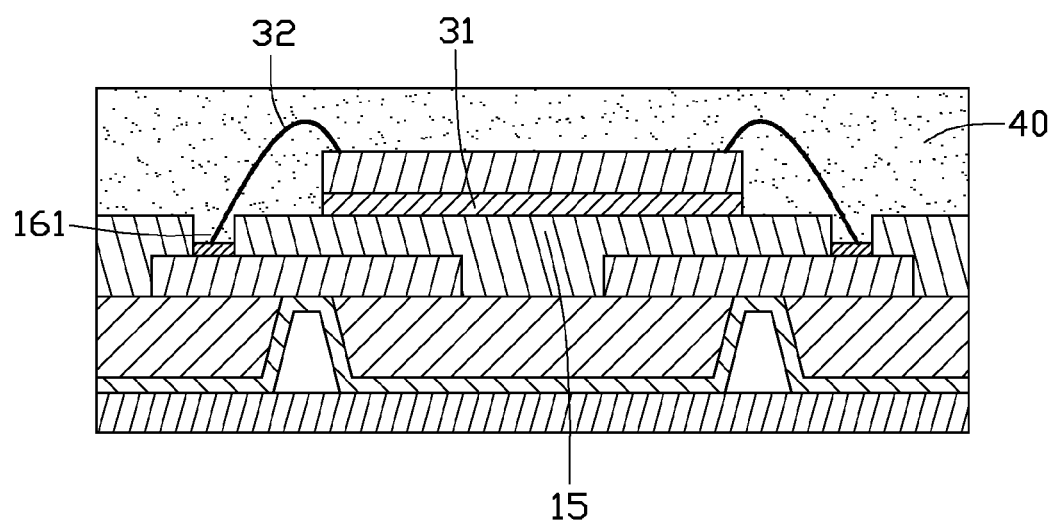
FIG. 10 shows a molding compound encapsulating the chip of FIG. 9 therein.

Step (5): referring to FIG. 10, the golden wires 32, the chip 30, the solder mask layer 15, and the surface plating layer 161 are encapsulated by a molding compound, thereby forming an encapsulating layer 40. In this embodiment, the molding compound can be epoxy molding compound.

Figure 11:
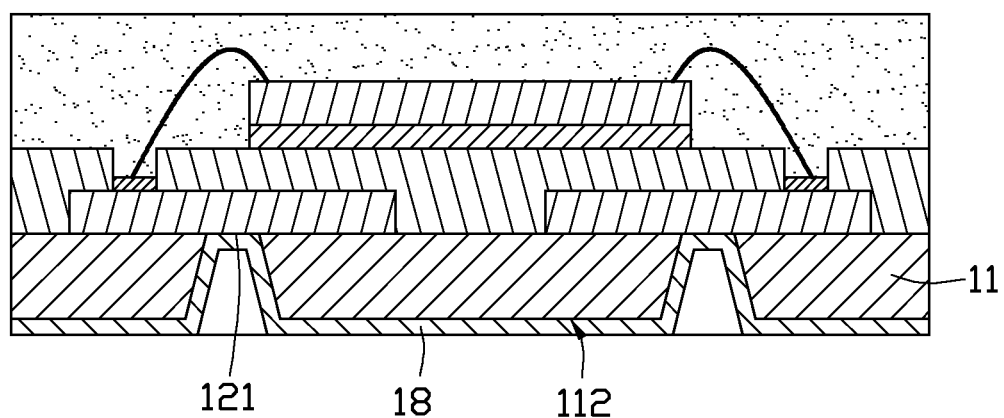
FIG. 11 shows the stiffer of FIG. 10 removed.
Figure 12:
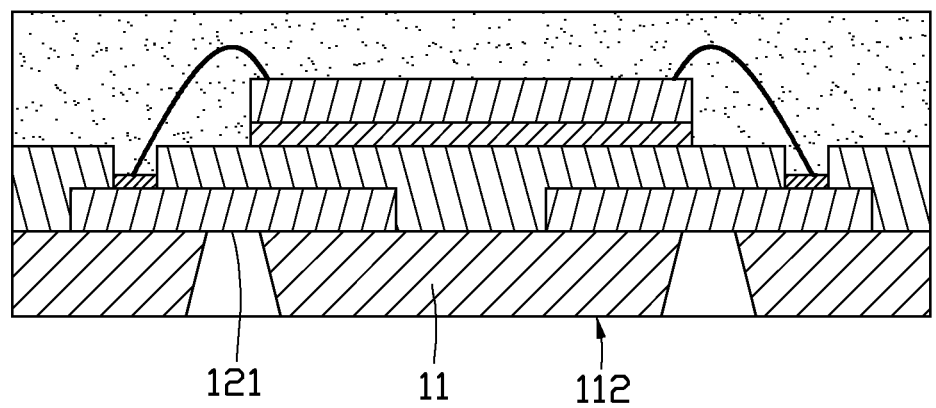
FIG. 12 shows the seed layer of FIG. 11 removed.

Step (6): referring to FIGS. 11 and 12, the stiffener 115 and the seed layer 18 are removed. In this embodiment, the stiffener 115 can be removed using a stripping technology. The seed layer 18 can be removed using etching.

Figure 13:
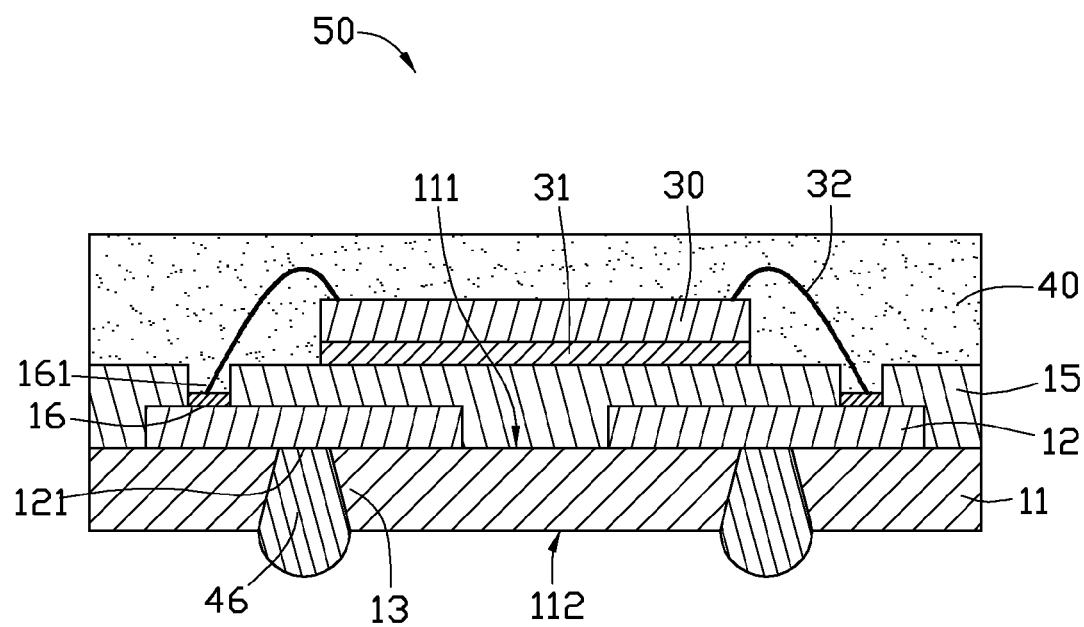
FIG. 13 shows a solder bump in each of the through holes of FIG. 12 and electrically connected to the patterned electrically conductive layer in the through hole, and the solder bumps projected out of the through hole, thereby obtaining a chip package.

Step (7): referring to FIG. 13, solder materials are filled in and overflow the through holes 13, thereby forming a plurality of solder balls 46 respectively electrically connected to the first conductive pads 121. Thus, a chip package 50 is obtained.

In other embodiments, the end portion of the solder ball 46 can also be cylindrical or ellipsoid-shaped. A material of the solder ball 46 can be comprised of tin. The solder balls 46 can be formed using screen printing or plating.

In this embodiment, the chip package 50 includes an insulation layer 11, an patterned electrically conductive layer 12 formed the first surface 111 of the insulation layer 11, a solder mask layer 15, a chip 30, an encapsulating layer 40 and a plurality of solder balls 46. The insulation layer 11 defines a plurality of through holes 13 passing through the second surface 112 and the first surface 111 of the insulation layer 11. The patterned electrically conductive layer 12 covers the through holes 13 at the first surface 111. The patterned electrically conductive layer 12 in the through hole forms a plurality of first conductive pads 121. The solder mask layer 15 is formed on the patterned electrically conductive layer 12 and the first surface 111 not covered by the patterned electrically conductive layer 12. The solder mask layer 15 defines a plurality of openings 162 for exposing part of the patterned electrically conductive layer 12. The patterned electrically conductive layer 12 exposed to the openings 162 forms a plurality of second conductive pads 16. The second conductive pads 16 are respectively electrically connected to the first conductive pads 121. A surface plating layer 161 is formed on each of the second conductive pads 16. The solder balls 46 are respectively formed in the through holes 13 and protrude from the second surface 112. The solder balls 46 are respectively electrically connected to the first conductive pads 121. The chip 30 is fixed on the solder mask layer 15 through an adhesive layer 31. The chip 30 is electrically connected to the surface plating layers 161 on the second conductive pads 16 through a plurality of golden wires 32. The golden wires 32 correspond to the second conductive pads 16. The golden wires 32, the chip 30, the solder mask layer 15, and the surface plating layer 161 are encapsulated in the encapsulating layer 40.

In this embodiment, the circuit board 20 and the chip package 50 just include a single patterned electrically conductive layer 12. Thus, the circuit board 20 and the chip package 50 are thinner, and the methods of manufacturing are easier.

Figure 14:
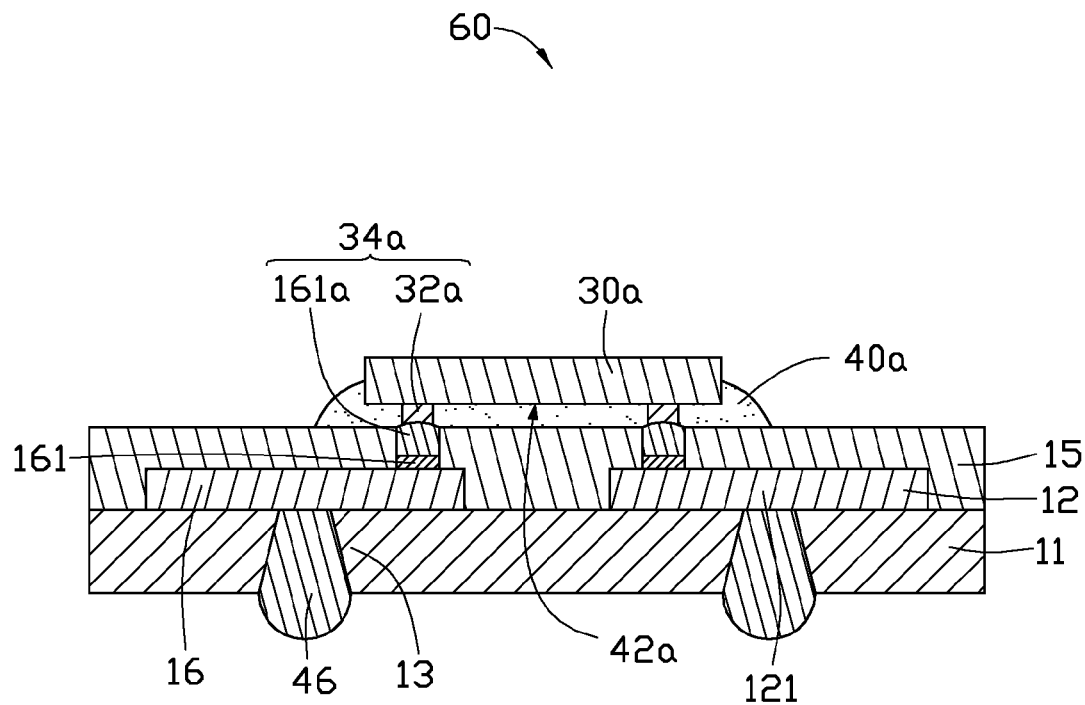
FIG. 14 is a cross-sectional view of a chip package in accordance with a second exemplary embodiment.

FIG. 14 shows a method for manufacturing a chip package 60 in accordance with a second exemplary embodiment. The method of this embodiment is similar to the method of the first exemplary embodiment, and the distinguishing features that are the steps (4)-(5) in the first exemplary embodiment are replaced by the following steps (4')-(5'):

Step (4'): a chip 30a is electrically connected to the second conductive pads 16 through a plurality of solder bumps 34a. The chip 30a is fixed to the circuit board 20 using a flip-chip method. The chip 30a includes a plurality of contact bumps 32a corresponding to the second conductive pads 16. A plurality of solder bumps 161a are formed on the surface plating layer 161 on the second conductive pads 16. The chip 30a is positioned on the circuit substrate 20 in a manner that the contact bumps 32a contact the corresponding solder bumps 161a. Then each of the contact bumps 32a and the corresponding solder bumps 161a are melted using a reflow soldering to form the solder bump 34a having a single continuous body of material.

In this embodiment, the solder bumps 161a can be formed using screen printing or plating. The solder bumps 161a projects beyond the surface of the solder mask layer 15. An end portion of each of the solder bumps 161a can be cylindrical or ball-shaped. A material of the solder bump 161a can be comprised of tin.

Step (5'): An underfill is filled into the gap between a bottom surface 42a of the chip 30a and the surface of the solder mask layer 15, forming an underfill layer 40a. The underfill layer 40a firmly fixes the chip 30a to the circuit board 20. The underfill is filed through a capillary action of the gap between the bottom surface 42a of the chip 30a and the surface of the solder mask layer 15 when the underfill is arranged at the opening of the gap. The underfill layer 40a can be comprised of an epoxy resin, such as Loctite 3536.

Referring to FIG. 14, after the steps similar to steps (6)-(7) of the first exemplary embodiment, a chip package 60 is obtained. The chip package 60 is similar to the chip package 50 of the first exemplary embodiment. The distinguishing features are that the chip package 60 includes a chip 30a instead of the chip 30 in the first exemplary embodiment. The chip 30a is electrically connected to the surface plating layers 161 on the second conductive pads 16 with a plurality of solder bumps 34a. The gap between a bottom surface 42a of the chip 30a and the surface of the solder mask layer 15 is filled with the underfill layer 40a, thereby firmly fixing the chip 30a to the circuit board 20.

While certain embodiments have been described and exemplified above, various other embodiments from the foregoing disclosure will be apparent to those skilled in the art. The present disclosure is not limited to the particular embodiments described and exemplified, but is capable of considerable variation and modification without departure from the scope and spirit of the appended claims.

The invention claimed is:

1. A method for manufacturing a chip package, comprising:
   providing a circuit board, wherein the circuit board comprises an insulation layer, the insulation layer has a first surface, an opposite second surface, and a plurality of through holes passing through the first and second surfaces, a patterned electrically conductive layer is formed on the first surface of the insulation layer, the patterned electrically conductive layer has a plurality of portions exposed in the through holes to serve as a plurality of first conductive pads, a solder mask layer covers the patterned electrically conductive layer, the solder mask defines a plurality of openings to expose parts of the patterned electrically conductive layer, the exposed parts of the patterned electrically conductive layer serves as a plurality of second conductive pads, the second conductive pads are electrically connected to the first conductive pads respectively, a seed layer is formed over the second surface, inner surfaces of the through holes, and the first conductive pads are exposed in the through holes, and a stiffener is attached on the seed layer on the second surface and covers the through holes at the second surface;
   mounting a chip to the circuit board, and electrically connecting the chip with the second conductive pads of the circuit board; and
   removing the stiffener and the seed layer, thereby obtaining a chip package.

2. The method of claim 1, further comprising a step: forming a solder ball on each of the first conductive pads, the solder balls protruding from the second surface of the insulation layer.

3. The method of claim 1, wherein the providing a circuit board comprises:
   providing a single-sided copper clad laminate, the single-sided copper clad laminate comprising the insulation layer and a copper foil, the copper foil being formed on the first surface of the insulation layer;
   forming the through holes passing through the first and second surfaces;
   removing portions of the copper foil to obtain the patterned electrically conductive layer; and
   forming the solder mask layer on the patterned electrically conductive layer, and defining the openings in the solder mask layer to expose parts of the patterned electrically conductive layer.

4. The method of claim 1, wherein the step of mounting the chip to the circuit board comprises:
   fixing the chip on the solder mask layer, and electrically connecting the chip to the second conductive pads using a plurality of golden wires; and
   encapsulating the golden wires, the solder mask layers, the second conductive pads and the chip in a molding compound.

5. The method of claim 1, wherein the chip further comprises a plurality of contact bumps corresponding to the second conductive pads, and the method for mounting the chip to the circuit board further comprises:
   forming a first solder bump on each of the second conductive pads;
   positioning the chip on the circuit board in a manner that the contact bumps respectively contact the first solder bumps, and melting the contact bumps and the first solder bumps to form a plurality of second solder bumps connecting the chip and the second conductive pads; and filling an underfill into a gap between a bottom of the chip and the circuit board, thereby firmly fixing the chip to the circuit board.

6. The method of claim 1, wherein the circuit board further comprises a plurality of surface plating layers respectively formed on the second conductive pads, and a method for forming the surface plating layers is selected from the group consisting of gold plating, nickel gold plating, nickel palladium gold plating, and tin plating.

* * * * *